United States Patent
Li et al.

(10) Patent No.: US 12,144,196 B2
(45) Date of Patent: Nov. 12, 2024

(54) DISPLAY SUBSTRATE WITH INORGANIC PROTECTIVE LAYER BETWEEN CONDUCTING LAYER AND INSULATING LAYER AND FABRICATION METHOD THEREOF, AND DISPLAY DEVICE

(71) Applicants: Chongqing BOE Display Technology Co., Ltd., Chongqing (CN); BOE Technology Group Co., Ltd., Beijing (CN)

(72) Inventors: Jie Li, Beijing (CN); Wei Zhang, Beijing (CN); Zeliang Li, Beijing (CN); Zhendong Li, Beijing (CN); Fei Fang, Beijing (CN)

(73) Assignees: Chongqing BOE Display Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 469 days.

(21) Appl. No.: 17/508,891

(22) Filed: Oct. 22, 2021

(65) Prior Publication Data
US 2022/0302414 A1    Sep. 22, 2022

(30) Foreign Application Priority Data
Mar. 19, 2021   (CN) .......................... 202110295178.3

(51) Int. Cl.
*H10K 50/844*   (2023.01)
*H10K 71/00*   (2023.01)

(52) U.S. Cl.
CPC ........... *H10K 50/844* (2023.02); *H10K 71/00* (2023.02)

(58) Field of Classification Search
None
See application file for complete search history.

(56) References Cited

U.S. PATENT DOCUMENTS

2003/0094615 A1* 5/2003 Yamazaki ......... H01L 29/78633
                                             257/E27.111
2014/0092354 A1   4/2014 Moriwaki
(Continued)

FOREIGN PATENT DOCUMENTS

CN    102171746 A    8/2011
CN    108550588 A    9/2018

OTHER PUBLICATIONS

CN202110295178.3 first office action.

*Primary Examiner* — Daniel Whalen
(74) *Attorney, Agent, or Firm* — IPro, PLLC

(57) ABSTRACT

A display substrate includes: a base substrate; a first conducting layer; a first insulating layer, where the first insulating layer is provided with a first opening; a second conducting layer, connected to the first conducting layer through the first opening, and including a first portion and a second portion, where the first portion is located within the first opening, and the second portion is located outside the first opening and located on the side of the first insulating layer facing away from the base substrate; and an inorganic protective layer including at least a first inorganic protective layer portion located between the second portion and the first insulating layer; in a direction perpendicular to the base substrate, the thickness $h_1$ of the first inorganic protective layer portion and the thickness $h_2$ of the second portion satisfy the following relationship: $h_2=K*h_1$, wherein $12 \leq K \leq 18$.

18 Claims, 8 Drawing Sheets

(56) References Cited

U.S. PATENT DOCUMENTS

2019/0157628 A1     5/2019   Kim et al.
2020/0411617 A1   12/2020   Kishimoto
2021/0366850 A1   11/2021   Wang \* cited by examiner _# DISPLAY SUBSTRATE WITH INORGANIC PROTECTIVE LAYER BETWEEN CONDUCTING LAYER AND INSULATING LAYER AND FABRICATION METHOD THEREOF, AND DISPLAY DEVICE This application claims priority to Chinese Patent Application No. 202110295178.3, filed on Mar. 19, 2021, which is hereby incorporated by reference in its entirety.

FIELD

The present disclosure relates to the field of display, and in particular to a display substrate and a fabrication method thereof, and a display device.

BACKGROUND

Organic electroluminescent displays (OLED) are considered to be star products of next generation displays because of their characteristics of self-glowing, high brightness, wide viewing angle, fast reaction time, and capability of fabricating red-green-blue (R/G/B) full color components.

SUMMARY

Embodiments of the present disclosure provide a display substrate and a fabrication method thereof, and a display device to solve the aluminum corrosion problem existing in the related art.

An embodiment of the present disclosure provides a display substrate including: a base substrate; a first conducting layer, located on the base substrate; a first insulating layer, located on a side of the first conducting layer facing away from the base substrate, where the first insulating layer is provided with a first opening; a second conducting layer, where the second conducting layer is connected to the first conducting layer through the first opening, and includes a first portion and a second portion, where the first portion is located within the first opening, and the second portion is located outside the first opening and located on a side of the first insulating layer facing away from the base substrate; and an inorganic protective layer, where the inorganic protective layer at least includes a first inorganic protective layer portion located between the second portion and the first insulating layer; in a direction perpendicular to the base substrate, the thickness $h_1$ of the first inorganic protective layer portion and the thickness $h_2$ of the second portion satisfy the following relationship: $h_2=K*h_1$, where $12 \leq K \leq 18$.

In the above display substrate provided by embodiments of the disclosure, the orthographic projection of an edge of the side of the first inorganic protective layer portion far away from the first opening on the base substrate is located on the side, far away from the first opening, of the orthographic projection of an edge of the side of the second portion far away from the first opening on the base substrate.

In the above display substrate provided by embodiments of the disclosure, the inorganic protective layer further includes a second inorganic protective layer portion lapping on the side surface of the first insulating layer close to the first opening.

In the above display substrate provided by embodiments of the present disclosure, the inorganic protective layer further includes a third inorganic protective layer portion, where the third inorganic protective layer portion is located on the side of the first insulating layer facing away from the base substrate and located on the side of the first inorganic protective layer portion far away from the first opening; in a direction perpendicular to the base substrate, the thickness of the third inorganic protective layer portion is less than the thickness of the first inorganic protective layer portion.

In the above display substrate provided by embodiments of the present disclosure, 400 Å$\leq h_1 \leq$600 Å, and 5000 Å$\leq h_2 \leq$10000 Å.

In the above display substrate provided by embodiments of the present disclosure, the material of the second conducting layer includes an aluminum element.

In the above display substrate provided by embodiments of the present disclosure, the material of the first insulating layer includes an organic insulating material.

An embodiment of the present disclosure further provides a fabrication method of a display substrate, including: providing a base substrate; forming a pattern of a first conducting layer on the base substrate; forming a first insulating layer provided with a first opening on the pattern of the first conducting layer; fabricating an inorganic protective layer on the first insulating layer using a mask for fabricating the first insulating layer, where the inorganic protective layer at least includes a first inorganic protective layer portion, and the first inorganic protective layer portion does not overlap with the first opening; and forming a pattern of a second conducting layer on the inorganic protective layer, where the pattern of the second conducting layer is connected with the pattern of the first conducting layer through the first opening, and in a direction perpendicular to the base substrate, the thickness $h_2$ of the second portion and the thickness $h_1$ of the first inorganic protective layer portion satisfy the following relationship: $h_2=K*h_1$, where $12 \leq K \leq 18$.

In the above fabrication method provided by embodiments of the disclosure, forming a pattern of a second conducting layer on the inorganic protective layer specifically includes: forming a pattern of a second conducting layer on the inorganic protective layer using a dry etching process; after forming a pattern of a second conducting layer on the inorganic protective layer, the fabrication method further includes: removing residual $Cl_2$ during the dry etching process using $CF_4$ and $O_2$ and the inorganic protective layer made of a-Si material that is not shielded by the pattern of the second conducting layer.

Embodiments of the present disclosure also provide a display device including the display substrate described above.

DETAILED DESCRIPTION OF THE EMBODIMENTS

Figure 1:
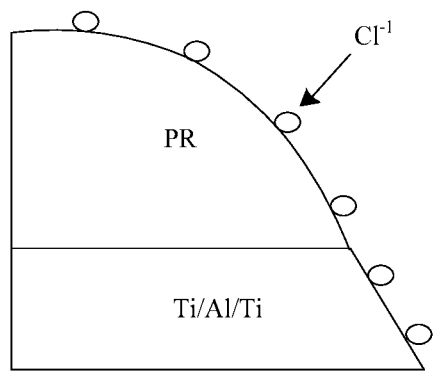
FIGS. 1 to 3 are respectively occurring principle diagrams of aluminum corrosion in the related art.

In order to make the objects, technical solutions and advantages of embodiments of the present disclosure clearer, technical solutions of embodiments of the present disclosure will be clearly and completely described below in conjunction with the accompanying drawings of embodiments of the present disclosure. It is noted that the sizes and shapes of the figures in the drawings do not reflect a true scale, but are merely illustrative of the disclosure. In addition, the same or similar reference numerals throughout refer to the same or similar elements or elements having the same or similar function. Clearly, the described embodiments are a part of the embodiments, but not all embodiments. Based on the described embodiments of the present disclosure, all other embodiments obtained by a person of ordinary skill in the art without creative work fall within the protection scope of the present disclosure.

Unless otherwise defined, technical or scientific terms used herein should be taken as the ordinary meaning understood by one of ordinary skill in the art to which this disclosure belongs. The terms "first," "second," and the like used herein in the description and claims of the present disclosure do not represent any order, quantity, or importance, but rather are used merely to distinguish one component from another. The word "including" or "containing" and the like means that elements or items preceding the word appear to encompass elements or items listed after the word and equivalents thereof, but does not exclude other elements or items. Words "inner", "outer", "upper", "lower" and the like are only used to indicate relative positional relationships, which may change accordingly when the absolute position of the object being described changes.

Figure 2:
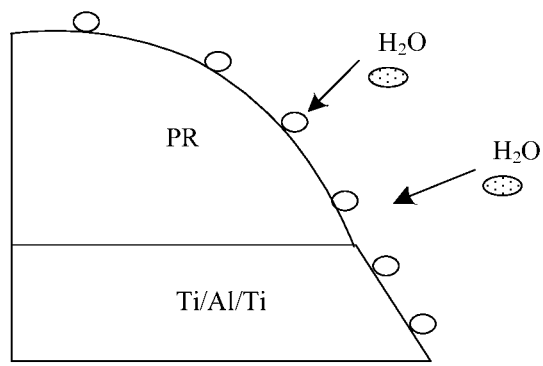
Figure 3:
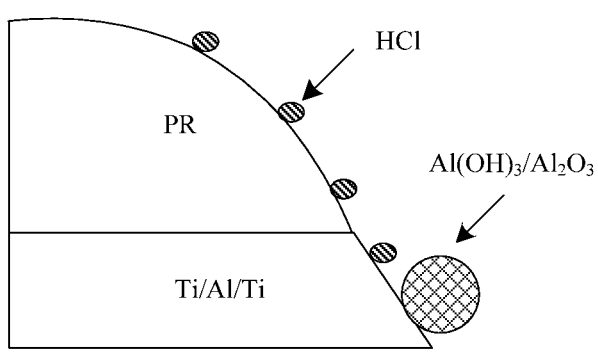

In an OLED pixel drive circuit, there are often the upper/lower conducting layers that need to be lapped through via holes of an insulating layer, where the Al corrosion problem arises when the conducting layers contain Al metal materials. In addition, in a large-size OLED product, since the Loading should be reduced as much as possible, there is a need to constantly thicken the upper/lower conducting layers, and with the thickening of the upper/lower conducting layers, the Al corrosion problem is increasingly severe. Specifically, as shown in FIGS. 1 to 3, after the process of etching the Al-containing conducting layer, residual chloride ions (Cl⁻) will react with the water molecules ($H_2O$) of the photoresist (PR) to form hydrogen chloride (HCl), and HCl, $H_2O$ and Al react to form $Al(OH)_3$, thus resulting in aluminum (Al) corrosion. Furthermore, when the insulating layer under the conducting layer is made of an organic insulating material, the organic insulating material contains more water vapor, which aggravates the corrosion situation.

Figure 4:
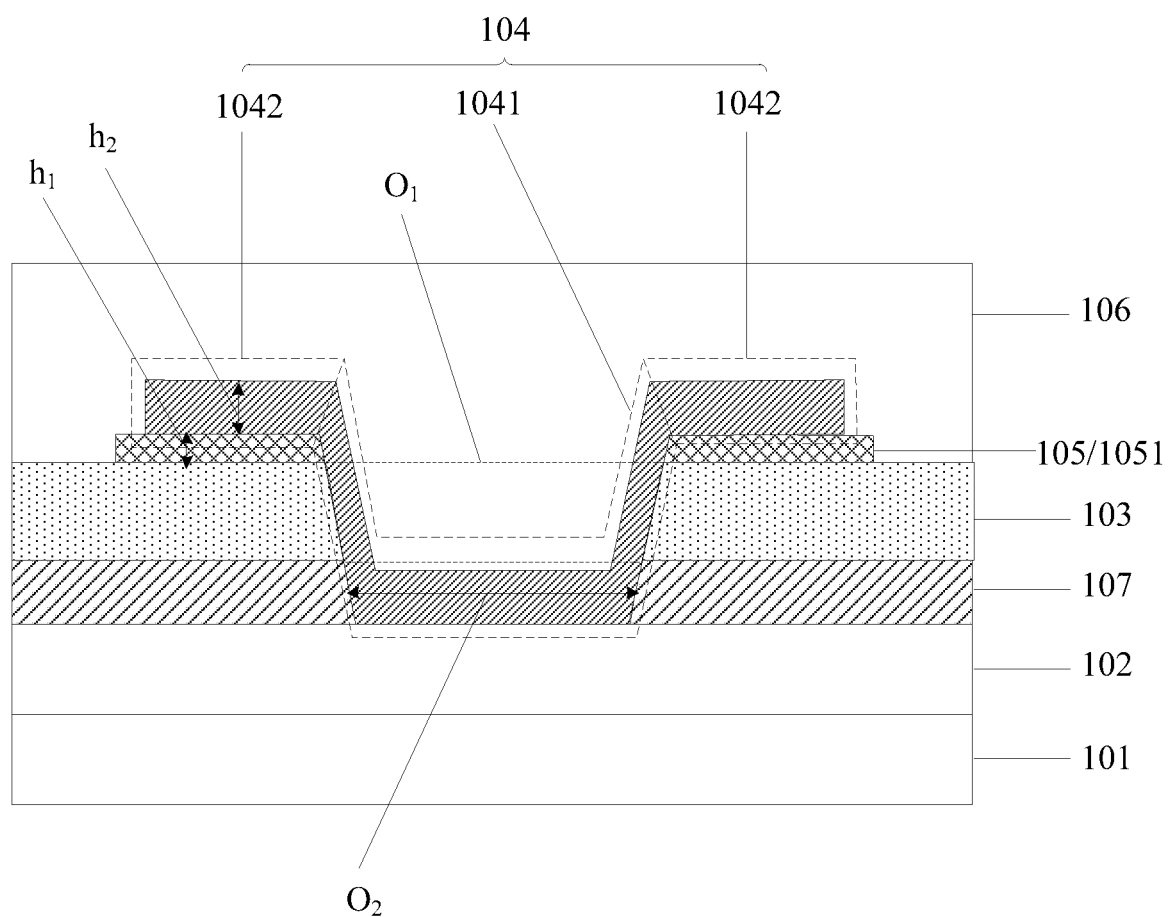
FIGS. 4 to 7 are respectively structural schematic diagrams of a display substrate provided by embodiments of the present disclosure.

In order to ameliorate the above problems existing in the related art, embodiments of the present disclosure provide a display substrate, as shown in FIG. 4. The display substrate includes: a base substrate 101; a first conducting layer 102, located on the base substrate 101; a first insulating layer 103, located on the side of the first conducting layer 102 facing away from the base substrate 101, where the first insulating layer 103 is provided with a first opening $O_1$; a second conducting layer 104, where the second conducting layer 104 is connected to the first conducting layer 102 through the first opening $O_1$, and includes a first portion 1041 and a second portion 1042, where the first portion 1041 is located within the first opening $O_1$, and the second portion 1042 is located outside the first opening $O_1$ and located on the side of the first insulating layer 103 facing away from the base substrate 101; and an inorganic protective layer 105, where the inorganic protective layer 105 includes at least a first inorganic protective layer portion 1051 located between the second portion 1042 and the first insulating layer 103, and in a direction perpendicular to the base substrate 101, the thickness $h_1$ of the first inorganic protective layer portion 1051 and the thickness $h_2$ of the second portion 1042 satisfy the following relationship: $h_2=K*h_1$, where $12 \leq K \leq 18$.

In the above display substrate provided by embodiments of the present disclosure, by arranging the first inorganic protective layer portion 1051 satisfying the above relational expression between the first insulating layer 103 and the second portion 1042, the first insulating layer 103 can be separated from the second conducting layer 104 by the first inorganic protective layer portion 1051, thereby avoiding contact of water vapor present in the first insulating layer 103 with chlorine gas ($Cl_2$) remaining from etching of the second conducting layer 104, thereby greatly improving Al corrosion.

It should be noted that, since the greater the thickness of the second conducting layer 104, the longer it takes to etch the pattern forming the second conducting layer 104, the thickness of the inorganic protective layer 105 needs to be greater, in this way, during etching of the pattern forming the second conducting layer 104, only a certain amount of loss of the inorganic protective layer 105 is caused, and the situation that the inorganic protective layer 105 is completely etched away will not appear, whereby damage to the surface of the first insulating layer 103 under the inorganic protective layer 105 can be avoided, and the first insulating layer 103 is prevented from being exposed to discharge water vapor to cause Al corrosion. In some embodiments, in order to comply with the trend of lightweight and thinning of the product, it is preferred in the present disclosure that the thickness $h_1$ of the first inorganic protective layer portion 1051 is 1/18-1/12 of the thickness $h_2$ of the second portion 1042.

In some embodiments, the material of the inorganic protective layer 105 may include, but is not limited to, amorphous silicon (a-Si), silicon nitride, silicon oxide, and the like. Since the film formation uniformity of a-Si is better, it can be made thinner, so that the inorganic protective layer 105 made of the a-Si material reduces the thickness as much as possible while improving Al corrosion, thereby satisfying the development of lightweight and thinning of the product. Also, a-Si is good in adhesion and can adhere well to the first insulating layer 103, thereby avoiding contact of water vapor in the first insulating layer 103 with $Cl_2$, which facilitates the Al corrosion problem. Therefore, in some embodiments, it is preferred that the inorganic protective layer 105 is made of an a-Si material.

In some embodiments, in the above display substrate provided by an embodiment of the disclosure, as shown in FIG. 4, an orthographic projection of an edge of a side of the first inorganic protective layer portion 1051 far away from the first opening $O_1$ on the base substrate 101 is located on a side, far away from the first opening $O_1$, of an orthographic projection of an edge of a side of the second portion 1042 far away from the first opening $O_1$ on the base substrate 101.

After the pattern of the second conducting layer 104 is formed, the etching time for aftertreatment (AT) will be increased to remove residual gases in an etching chamber. However, while the residual gases are removed, the surface composition of the first insulating layer 103 not shielded by the second conducting layer 104 may become abnormal, thereby weakening the adhesion between the first insulating layer 103 and a second insulating layer 106 which will be subsequently fabricated, resulting in partial peeling of the second insulating layer 106. In the present disclosure, in the process of removing the residual gases, the inorganic protective layer 105 not shielded by the second conducting layer 104 is etched such that the orthographic projection of an edge of the side of the first inorganic protective layer portion 1051 far away from the first opening $O_1$ on the base substrate 101 is located on the side, far away from the first opening $O_1$, of the orthographic projection of an edge of the side of the second portion 1042 far away from the first opening $O_1$ on the base substrate 101. In this way, the surface of the first insulating layer 103 under the inorganic protective layer 105 can be damaged less or even without any damage in the process of removing the residual gas, thereby guaranteeing greater adhesion between the first insulating layer 103 and the second insulating layer 106 and avoiding local abnormal peeling of the second insulating layer 106.

Figure 5:
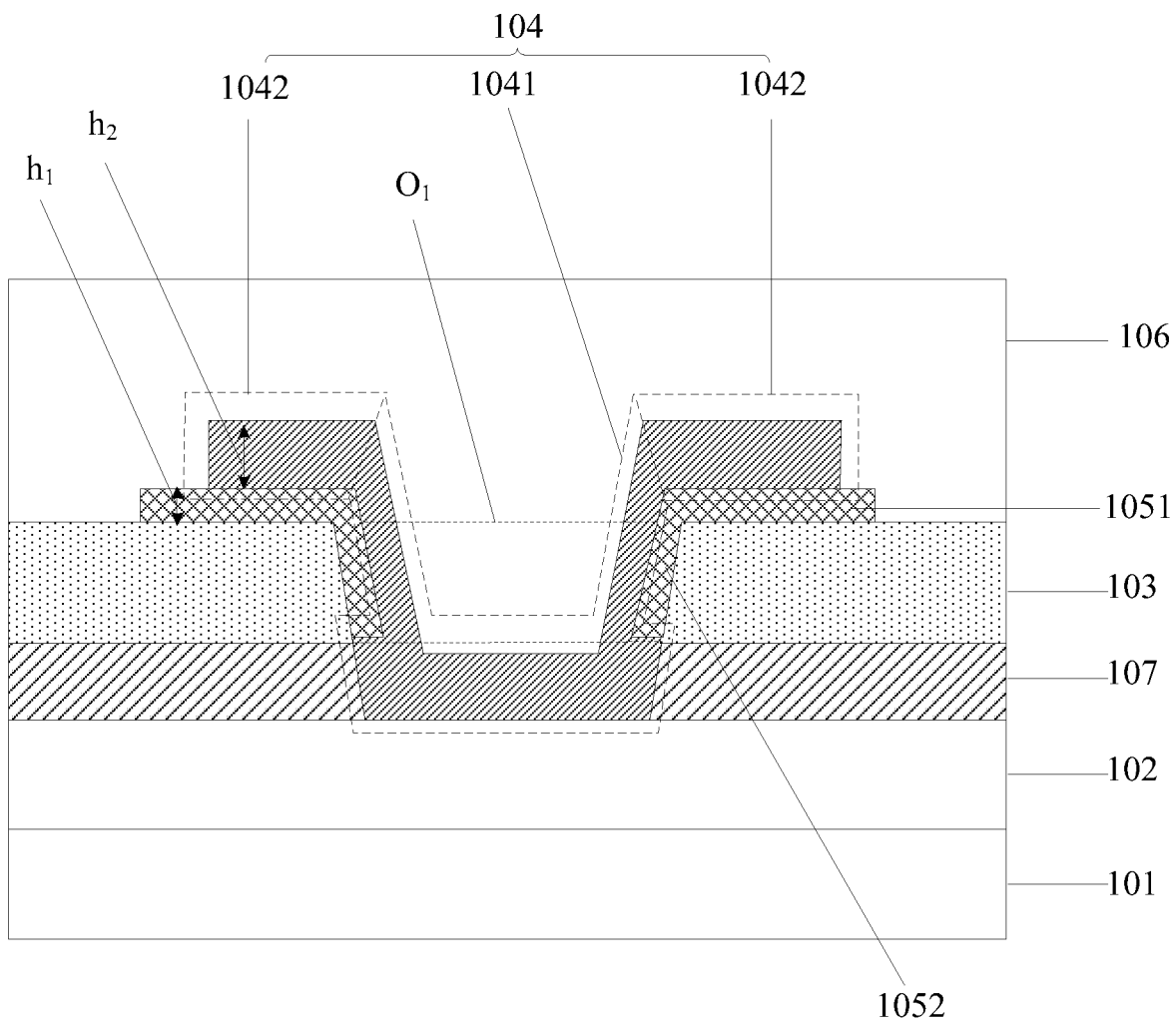

In some embodiments, in the above display substrate provided by embodiments of the disclosure, as shown in FIG. 5, the inorganic protective layer 105 further includes a second inorganic protective layer portion 1052. The second inorganic protective layer portion 1052 lap on the side surface of the first insulating layer 103 close to the first opening $O_1$. Thus, the first portion 1041 can be separated from the first insulating layer 103 by the second inorganic protective layer portion 1052, thereby preventing water vapor in the first insulating layer 103 from corroding the first portion 1041.

Figure 6:
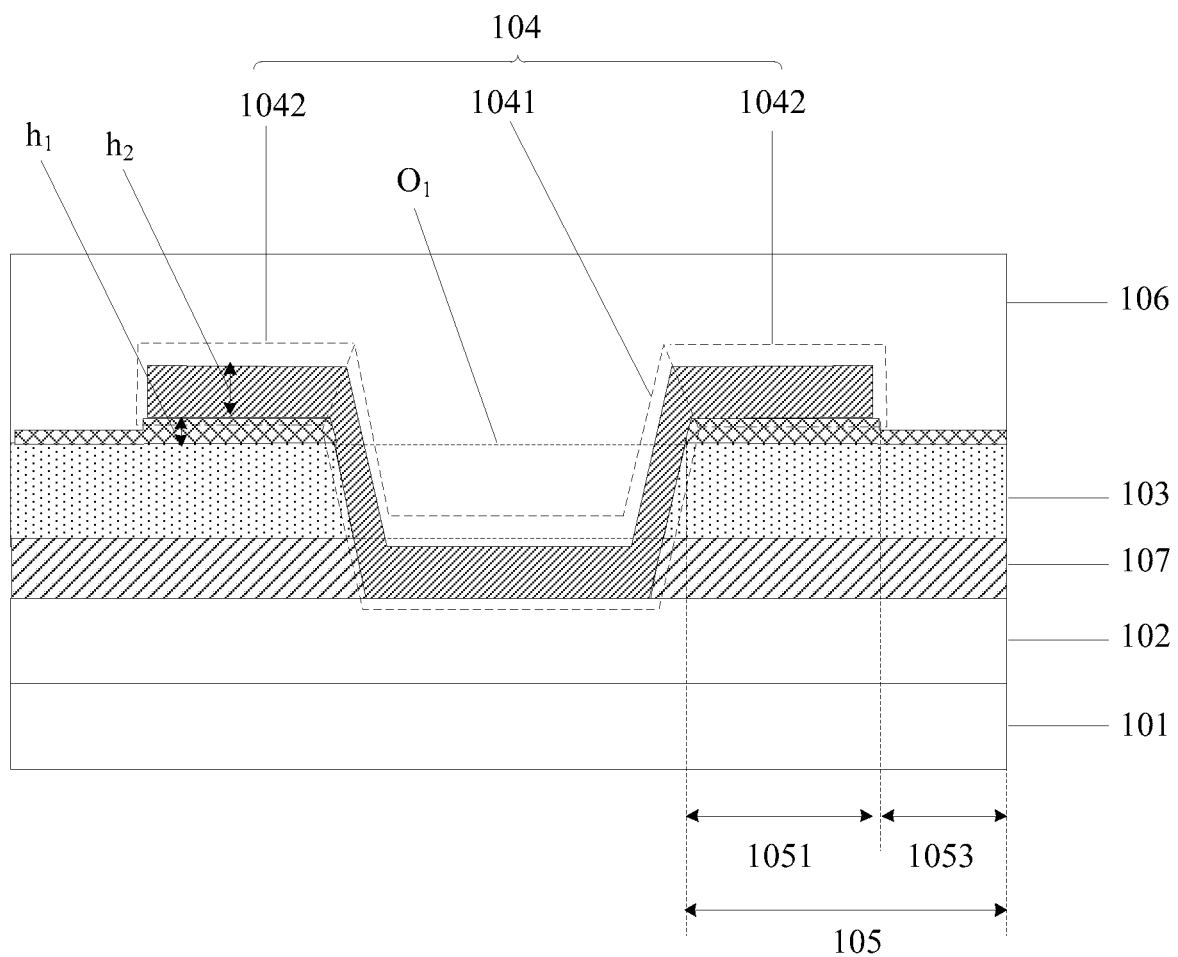
Figure 7:
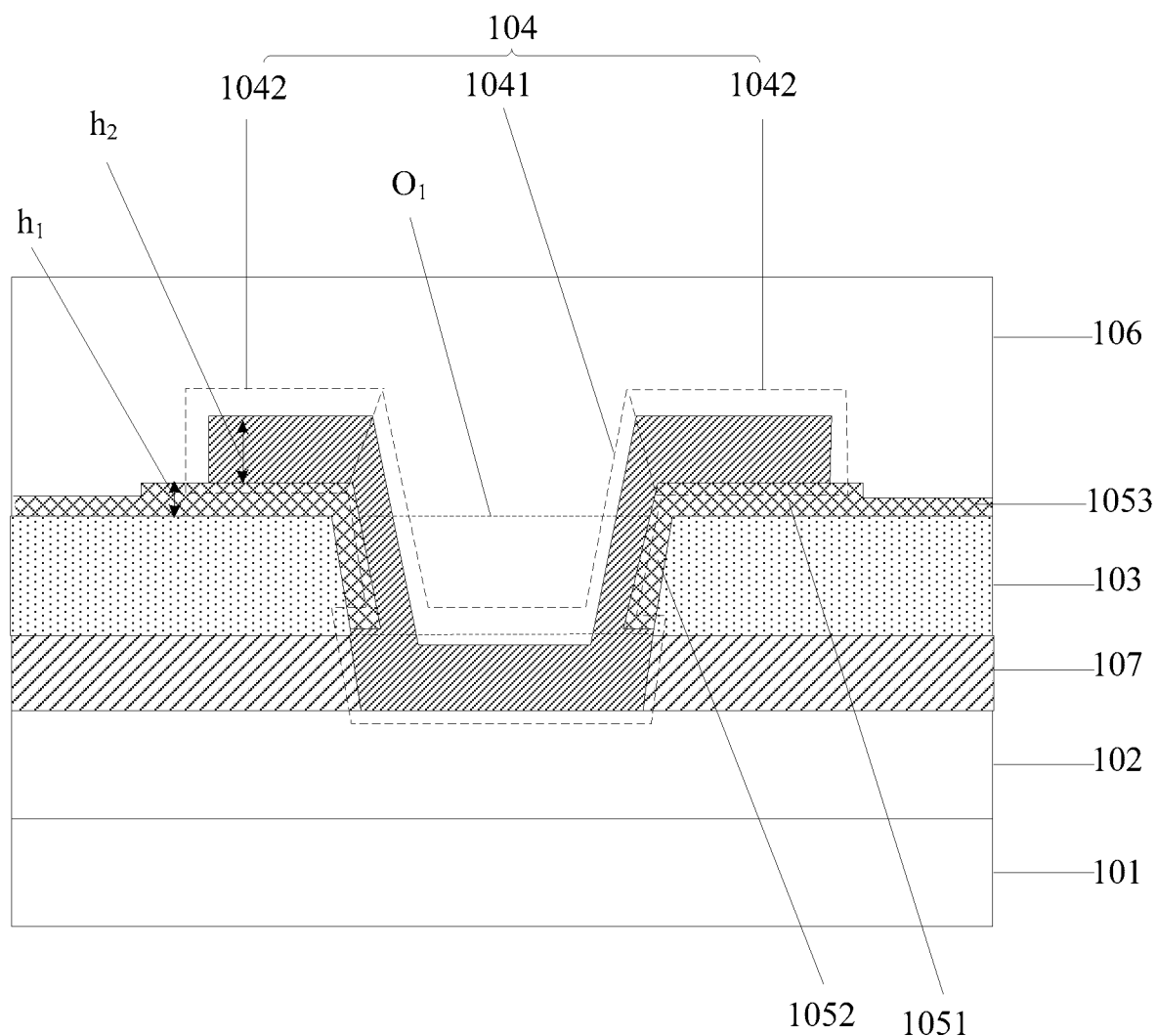

In some embodiments, in the above display substrate provided by embodiments of the disclosure, as shown in FIGS. 6 and 7, the inorganic protective layer 105 further includes a third inorganic protective layer portion 1053. The third inorganic protective layer portion 1053 is located on the side of the first insulating layer 103 facing away from the base substrate 101 and located on the side of the first inorganic protective layer portion 1051 far away from the first opening $O_1$. In a direction perpendicular to the base substrate 101, the thickness of the third inorganic protective layer portion 1053 is smaller than the thickness of the first inorganic protective layer portion 1051.

During the AT process to remove residual gases, a certain amount of loss may be caused to the third inorganic protective layer portion 1053 not shielded by the second conducting layer 104, such that the thickness of the third inorganic protective layer portion 1053 not shielded by the second conducting layer 104 is less than the thickness of the first inorganic protective layer portion 1051. In addition, the third inorganic protective layer portion 1053 effectively protects the first insulating layer 103 during the AT treatment to remove residual gases, and due to the good adhesion of the third inorganic protective layer portion 1053, the second insulating layer 106 which will be subsequently fabricated has greater adhesion to the third inorganic protective layer portion 1053, thereby preventing local abnormal peeling of the second insulating layer 106.

In some embodiments, in the above display substrate provided by embodiments of the disclosure, the thickness $h_1$ of the first inorganic protective layer portion 1051 is in the value range of 400 Å≤$h_1$≤600 Å, for example the thickness $h_1$ may be 400 Å, 450 Å, 500 Å, 600 Å, etc.; the thickness $h_2$ of the second portion 104 is in the value range of 5000 Å≤$h_2$≤10000 Å, for example, the thickness $h_2$ may be 5000 Å, 5500 Å, 6000 Å, 6500 Å, 7000 Å, 7500 Å, 8000 Å, 8500 Å, 9000 Å, 9500 Å, 10000 Å, or the like.

The second conducting layer 104 satisfying the above-described value range of thickness may have a smaller resistance. The first inorganic protective layer portion 1051 satisfying the above-described value range of thickness can effectively insulate water vapor in the first insulating layer 103 and prevent water vapor from making contact with $Cl_2$ to cause Al corrosion and can protect the surface of the first insulating layer 103 well during AT treatment, thereby avoiding damage to the surface of the first insulating layer 103, and guaranteeing greater adhesion between the first insulating layer 103 and the second insulating layer 106 which will be subsequently fabricated. In addition, in a case where the second conducting layer 104 and the first inorganic protective layer portion 1051 satisfy the above-described value range of thickness at the same time, not only can a small resistance of the second conducting layer 104 be achieved and the Al corrosion problem be solved, but also a lightweight and thinning design of the product can be achieved.

In some embodiments, in the above display substrate provided by embodiments of the present disclosure, the material of the second conducting layer 104 is a single or composite material or the like including an aluminum element. In some embodiments, the aluminum element may be elemental aluminum metal. Exemplarily, the second conducting layer 104 may include a titanium metal layer (Ti), an aluminum metal layer (Al), and a titanium metal layer (Ti) that are stacked. The first conducting layer 102 may also include a titanium metal layer (Ti), an aluminum metal layer (Al), and a titanium metal layer (Ti) that are stacked. Optionally, the first conducting layer 102 may be a first source/drain metal layer (SD1) that may include source/drain (SD) of a transistor, a first data line, and other components; the second conducting layer 104 may be a second source/drain metal layer (SD2) that may include an adaptor electrode connecting the source of the transistor with the electrode of the light emitting device, a second data line, and other components; where the first data line and the second data line can be in lap joint through the first opening $O_1$ described above to form a data line (Data) of a two-layer wiring structure, thereby reducing the resistance of the data line.

In some embodiments, in the above display substrate provided by embodiments of the present disclosure, the material of the first insulating layer 103 includes an organic insulating material to facilitate planarization while achieving insulation, in which case the first insulating layer 103 acts as a first planarization layer (PLN1).

In some embodiments, the organic insulating material may be, but is not limited to, polyacrylic resin, polyepoxy acrylic resin, photosensitive polyimide resin, polyester acrylate, urethane acrylate resin and phenolic epoxy acrylic resin.

In some embodiments, the above display substrate provided by embodiments of the present disclosure, as shown in FIG. 4, further includes: a second insulating layer 106 located on the side of the second conducting layer 104 facing away from the base substrate 101. The second insulating layer 106 is in direct contact with the second conducting layer 104 and is in direct contact with the first inorganic protective layer portion 1051 and the first insulating layer 103 that are not shielded by the second conducting layer 104.

Due to blocking of the inorganic protective layer 105, the influence of the AT treatment on the first insulating layer 103 is relatively small, so that the adhesion between the first insulating layer 103 and the second insulating layer 106 is relatively large, and the second insulating layer 106 is free from abnormal peeling.

In some embodiments, the second insulating layer 106 serves as a second planarization layer (PLN2), and the material of the second insulating layer 106 includes, but is not limited to, an organic insulating material such as polyacrylic resin, polyepoxy acrylic resin, photosensitive polyimide resin, polyester acrylate, urethane acrylate resin, phenolic epoxy acrylic resin, or the like.

In some embodiments, the above display substrate provided by an embodiment of the present disclosure, as shown in FIG. 4, further includes an inorganic insulating layer 107 located between the first conducting layer 102 and the first insulating layer 103, and the inorganic insulating layer 107 is provided with a second opening $O_2$ communicating with the first opening $O_1$.

The inorganic insulating layer 107 is good in adhesion, so that the adhesion between the inorganic insulating layer 107 and the first conducting layer 102 under the inorganic insulating layer 107 and the adhesion between the inorganic insulating layer (PVX) 107 and the first insulating layer 103 on the inorganic insulating layer 107 can be effectively guaranteed to be large.

In some embodiments, the material of the inorganic insulating layer 107 includes, but is not limited to, silicon oxide, silicon nitride, silicon oxynitride, aluminum oxide, lead oxide, tantalum pentoxide, zirconium dioxide, other suitable dielectric materials, or combinations thereof.

Based on the same inventive concept, embodiments of the present disclosure provide a fabrication method of a display substrate, and since the problem solving principle of the fabrication method is similar to the problem solving principle of the display substrate described above, the implementation of the fabrication method provided by embodiments of the present disclosure can refer to the implementation of the display substrate provided by embodiments of the present disclosure, and the repetition thereof is not repeated.

Figure 8:
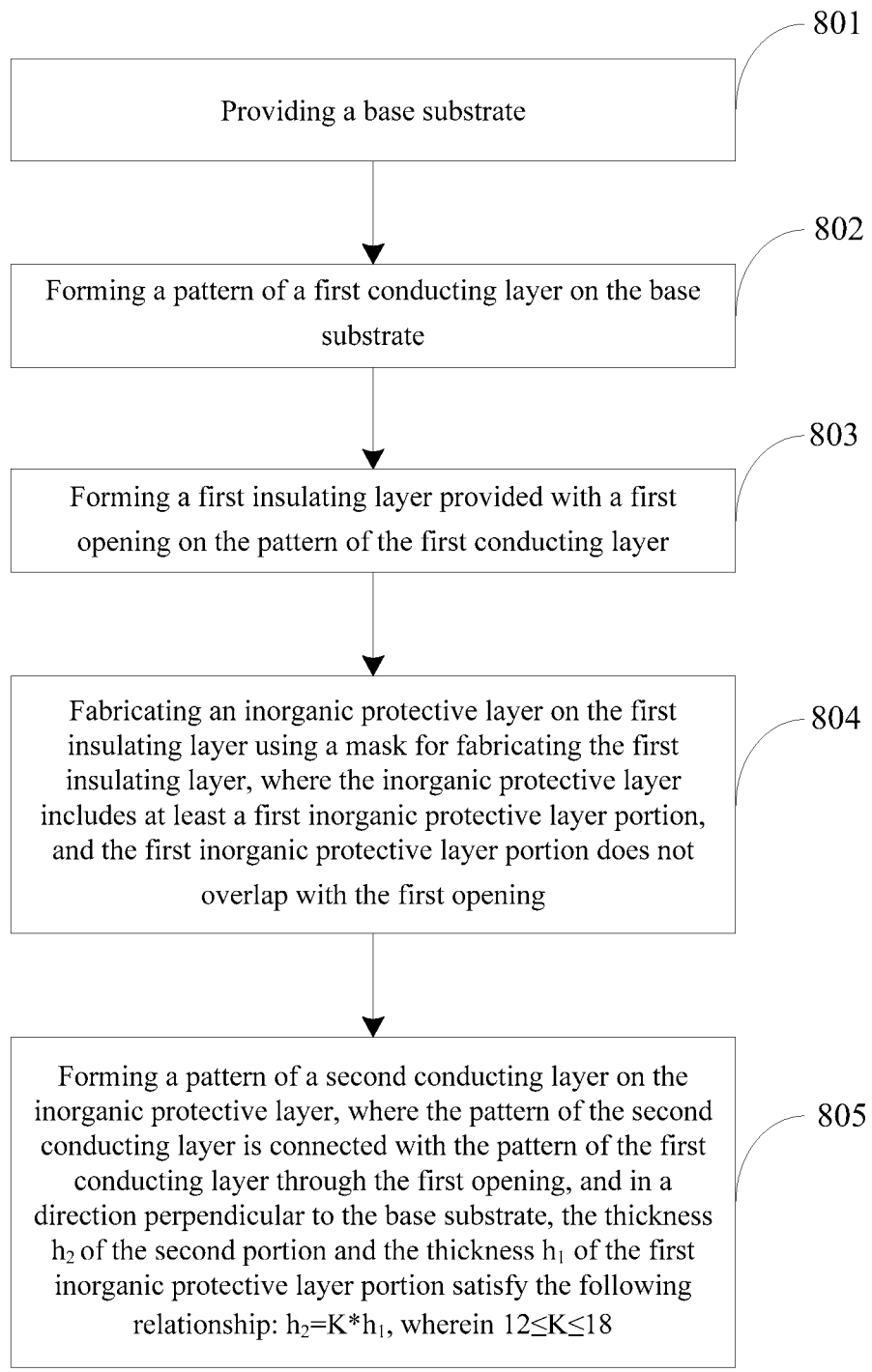
FIG. 8 is a flowchart of a fabrication method of a display substrate provided by embodiments of the present disclosure.

An embodiment of the present disclosure provides a fabrication method of a display substrate, as shown in FIG. 8, that includes the following steps.

S801, providing a base substrate.

S802, forming a pattern of a first conducting layer on the base substrate.

S803, forming a first insulating layer provided with a first opening on the pattern of the first conducting layer.

S804, fabricating an inorganic protective layer on the first insulating layer using a mask for fabricating the first insulating layer, where the inorganic protective layer includes at least a first inorganic protective layer portion, and the first inorganic protective layer portion does not overlap with the first opening.

S805, forming a pattern of a second conducting layer on the inorganic protective layer, where the pattern of the second conducting layer is connected with the pattern of the first conducting layer through the first opening, and in a direction perpendicular to the base substrate, the thickness $h_2$ of the second portion and the thickness $h_1$ of the first inorganic protective layer portion satisfy the following relationship: $h_2 = K \ast h_1$, where $12 \leq K \leq 18$.

In order to facilitate an understanding of the detailed schemes of the above-described fabrication method provided herein, the fabrication process of the display substrate shown in FIG. 4 is will be specifically described below.

Figure 9:
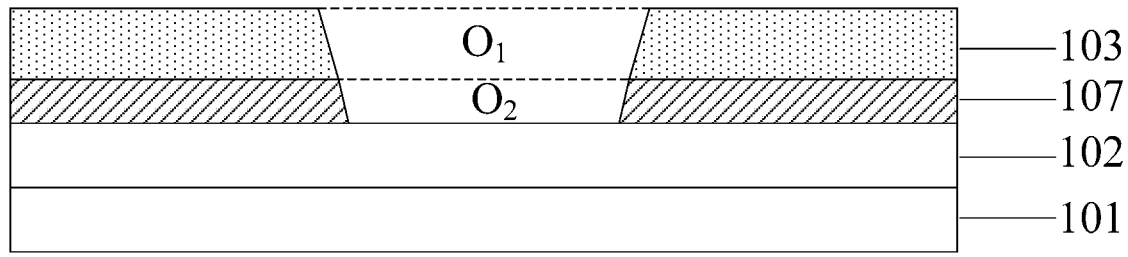
FIGS. 9 to 14 are respectively structural schematic diagrams of a display substrate shown in FIG. 4 during fabrication.

First step, as shown in FIG. 9, forming a pattern of a first conducting layer 102, an inorganic insulating layer 107 with a second opening $O_2$, a first insulating layer 103 with a first opening $O_1$ on a base substrate 101. The second opening $O_2$ communicates with the first opening $O_1$.

In some embodiments, the first opening $O_1$ and the second opening $O_2$ may be trapezoidal with a wide upper part and a narrow lower part, of course, may also be cylindrical, squared, or the like, and there is no limitation herein.

Figure 10:
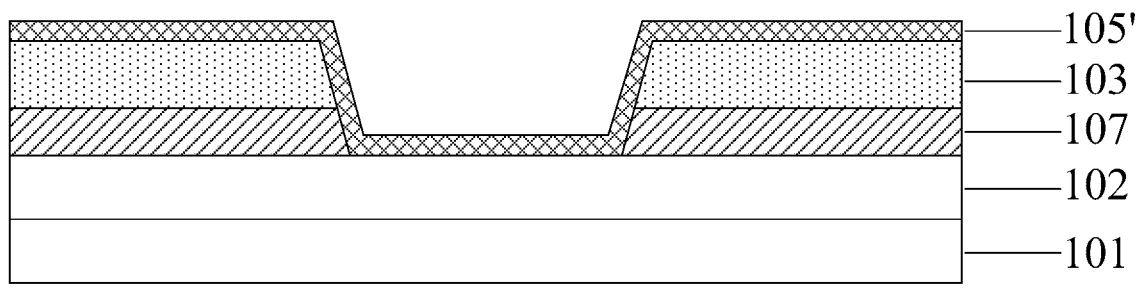
Figure 11:
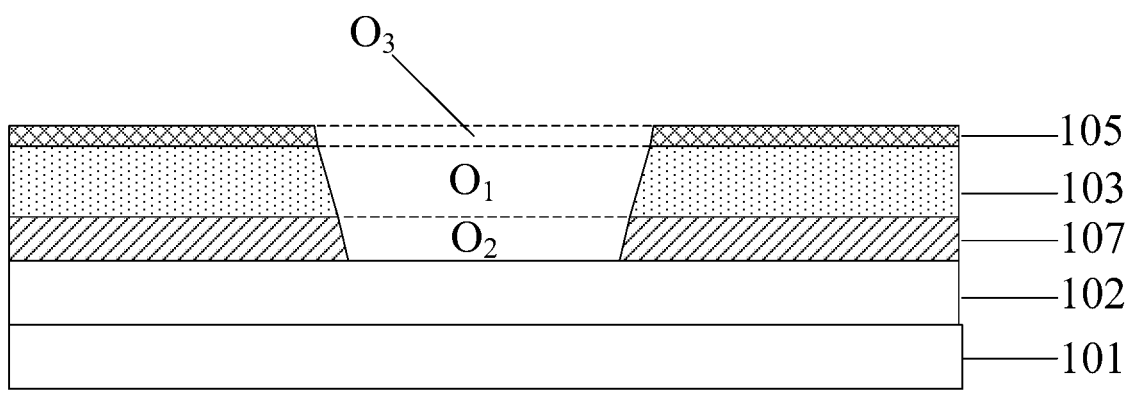

Second step, as shown in FIG. 10, forming an inorganic material layer 105' disposed in a whole surface on the first insulating layer 103; patterning the inorganic material layer 105' to form an inorganic protective layer 105 provided with a third opening $O_3$ using a mask for fabricating the first insulating layer 103, where the third opening $O_3$ communicates with the first opening $O_1$ of the first insulating layer 103, and the orthographic projection of the third opening $O_3$ on the base substrate 101 overlaps with the orthographic projection of the first opening $O_1$ on the base substrate 101, as shown in FIG. 11. Alternatively, the inorganic material layer 105' may be a 400 Å-600 Å thick a-Si material layer.

The inorganic protective layer 105 is formed by patterning the inorganic material layer 105' using the mask for fabricating the first insulating layer 103, such that the inorganic protective layer 105 can completely shield the first insulating layer 103, thereby effectively preventing water vapor in the first insulating layer 103 from making contact with $Cl_2$ remaining from the etching process of the second conducting layer 104, which facilitates the solving of the Al corrosion problem. In addition, there is no need to add a new mask to fabricate the inorganic protective layer 105, so that the design and development costs of the mask are omitted.

Figure 12:
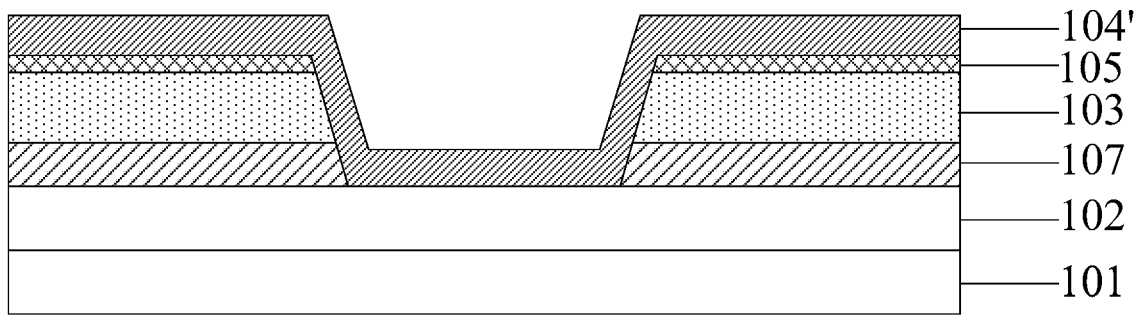
Figure 13:
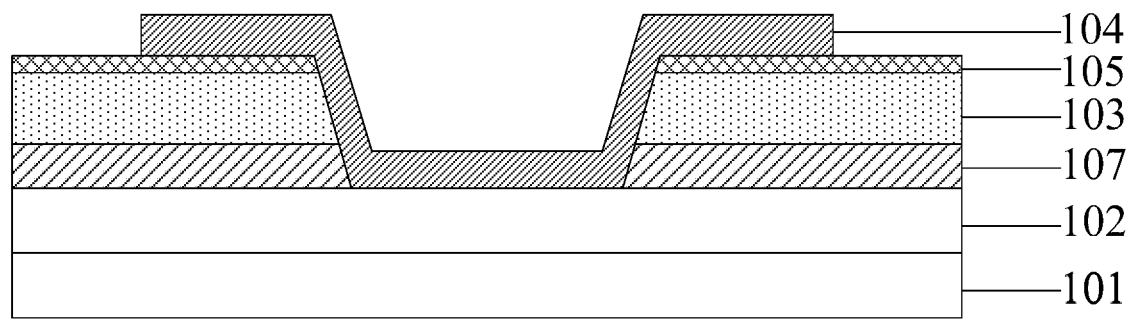
Figure 14:
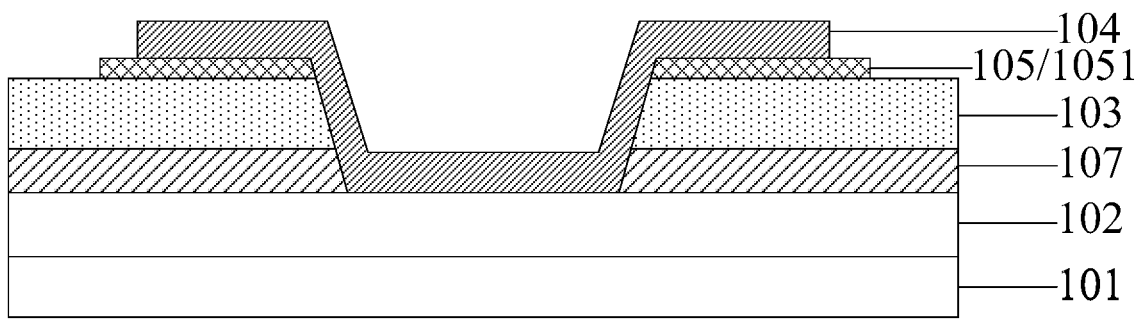

Third step, as shown in FIG. 12, forming a metal layer 104' having a Ti/Al/Ti stacking structure on the inorganic protective layer 105 in a whole surface; as shown in FIG. 13, etching the metal layer 104' using a dry etching process to form a pattern of the second conducting layer 104; as shown in FIG. 14, removing residual gas during the dry etching process (i.e., performing AT treatment), and removing the inorganic protective layer 105 not shielded by the pattern of second conducting layer 104 at the same time, to obtain a first inorganic protective layer portion 1051. Influenced by the material of the inorganic protective layer 105, the edge of the first inorganic protective layer portion 1051 far away from the first opening $O_1$ may be located on the side, far away from the first opening $O_1$, of the edge of the second conducting layer 104 far away from the first opening $O_1$ after the AT process ends.

Due to the presence of the inorganic protective layer 105, it can be ensured that the surface of the first insulating layer 103 is less damaged, and may even be free of any damage during the AT treatment, thus guaranteeing a greater adhesion between the first insulating layer 103 and the second insulating layer 106 and avoiding local abnormal peeling of the second insulating layer 106.

In some embodiments, carbon tetrafluoride ($CF_4$) and oxygen ($O_2$) may be adopted to remove residual $Cl_2$ during the etching process that forms the second conducting layer 104, as well as the inorganic protective layer 105 made of the a-Si material that is not shielded by the second conducting layer 104; where the ratio of the concentration of $CF_4$ to $O_2$ may be 6/5-5/3, and the etching rate may be 12 Å/s-14 Å/s. In some embodiments, the parameters such as the concentration of $CF_4$, the concentration of $O_2$ and the etching rate can be reasonably controlled according to the concentration of residual $Cl_2$ and the thickness of the inorganic protective layer 105.

It should be noted that, the residual $Cl_2$ needs to be completely removed because the residual $Cl_2$ and water vapor in the first insulating layer 103 may cause Al corrosion. In order to prevent fluorine in $CF_4$ from being deposited on the surface of the first insulating layer 103 excessively to affect the surface composition of the first insulating layer 103 to cause less adhesion between the first insulating layer 103 and the second insulating layer 106, when the $Cl_2$ is completely removed, it is preferred that the a-Si not shielded by the second conducting layer 104 is just removed; of course, in some embodiments, there may also be a thinner film layer of a-Si not shielded by the second conducting layer 104 when the $Cl_2$ is completely removed, however, due to the good adhesion of a-Si, the adhesion of the second insulating layer 106 which will be subsequently fabricated at the a-Si may be greater even if the a-Si is not completely removed, thereby avoiding local abnormal peeling of the second insulating layer 106; in other embodiments, it is also possible that a-Si not shielded by the second conducting layer 104 has been completely etched away, but $Cl_2$ is still not completely removed, in this case, given that in the present disclosure, the thickness of the a-Si material layer is related to the thickness of the second conducting layer 104, thus, by controlling the thickness of the a-Si material layer, a-Si not shielded by the second conducting layer 104 has been completely etched away, only very little $Cl_2$ is still not completely removed, such that $CF_4$ and $O_2$ change the surface composition of the first insulating layer 103 very little during the process of completely removing the very little $Cl_2$, and $CF_4$ and $O_2$ can cause the surface of the first insulating layer 103 to become slightly rough, and thus good adhesion between the first insulating layer 103 and the second insulating layer 106 can still be guaranteed.

Fourth step, as shown in FIG. 4, forming a second insulating layer 106 on the second conducting layer 104, where the second insulating layer 106 is in direct contact with the second conducting layer 104 and is in direct contact with the first inorganic protective layer portion 1051 and the first insulating layer 103 in a region outside the second conducting layer 104.

Hereto, the fabrication of the display substrate shown in FIG. 4 is completed.

It should be noted that, in the above fabrication method according to the embodiments of the present disclosure, forming all structure layers involves patterning processes that may include some or all of deposition, photoresist coating, mask masking, exposure, development, etching, photoresist stripping, etc., but may also include other processes, which is specifically subject to the shape of the required pattern during actual fabrication, whichever is not limiting herein. For example, a postbaking process may also be included after development and before etching.

Wherein, the deposition process may be chemical vapor deposition, plasma enhanced chemical vapor deposition, or physical vapor deposition, and there is no limitation herein; the mask used in the masking process may be a Half Tone Mask, a Single Slit Mask, or a Gray Tone Mask, and there is no limitation herein; the etching may be dry etching or wet etching, and there is no limitation herein.

Based on the same inventive concept, an embodiment of the present disclosure also provides a display device including the above-described display substrate provided by an embodiment of the present disclosure. Since the problem solving principle of the display device is similar to the problem solving principle of the display substrate described above, the implementation of the display device provided by an embodiment of the present disclosure can refer to the implementation of the above-described display substrate provided by an embodiment of the present disclosure, and repetition thereof is not repeated.

In some embodiments, the display device may be a mobile phone, a tablet computer, a television, a display, a laptop, a digital photo frame, a navigator, a smart watch, a fitness wristband, a personal digital assistant, and any product or component having a display function. The display device includes, but is not limited to, a radio frequency unit, a network module, an audio output unit, an input unit, a sensor, a display unit, a user input unit, an interface unit, a memory, a processor, a power supply and other components. One skilled in the art will appreciate that the structure of the display device described above does not constitute a limitation to the display device, and the display device may include more or fewer components described above, or combine certain components, or a different arrangement of components. In the present embodiments, the display device includes, but is not limited to, a display, a cell phone, a tablet computer, a television, a wearable electronic device, a navigation display device, and the like. In addition, the above-described display device provided by the embodiment of the present disclosure can be suitably used in an OLED display product or a display technology including a driver circuit such as a quantum dot display, and there is no limitation herein.

What is claimed is:

1. A display substrate, comprising:
   a base substrate;
   a first conducting layer, located on the base substrate;
   a first insulating layer, located on a side of the first conducting layer facing away from the base substrate, wherein the first insulating layer is provided with a first opening;
   a second conducting layer, connected to the first conducting layer through the first opening, and comprising a first portion and a second portion, wherein the first portion is located within the first opening, and the second portion is located outside the first opening and located on a side of the first insulating layer facing away from the base substrate; and
   an inorganic protective layer, comprising at least a first inorganic protective layer portion located between the second portion and the first insulating layer; wherein in a direction perpendicular to the base substrate, a thickness $h_1$ of the first inorganic protective layer portion and a thickness $h_2$ of the second portion satisfy the following relationship:

$h_2 = K*h_1$, wherein $12 \leq K \leq 18$;

wherein the inorganic protective layer further comprises a second inorganic protective layer portion, wherein the second inorganic protective layer portion is located on the side of the first insulating layer facing away from the base substrate and is located on a side of the first inorganic protective layer portion far away from the first opening; in the direction perpendicular to the base substrate, a thickness of the second inorganic protective layer portion is less than the thickness of the first inorganic protective layer portion.

2. The display substrate according to claim 1, wherein an orthographic projection of an edge of a side of the first inorganic protective layer portion far away from the first opening on the base substrate is located on a side, far away from the first opening, of an orthographic projection of an edge of a side of the second portion far away from the first opening on the base substrate.

3. The display substrate according to claim 1, wherein the inorganic protective layer further comprises a third inorganic protective layer portion lapping on a side surface of the first insulating layer close to the first opening.

4. The display substrate according to claim 1, wherein 400 Å $\leq h_1 \leq$ 600 Å, and 5000 Å $\leq h_2 \leq$ 10000 Å.

5. The display substrate according to claim 1, wherein a material of the second conducting layer comprises an aluminum element.

6. The display substrate according to claim 1, wherein a material of the first insulating layer comprises an organic insulating material.

7. A fabrication method of a display substrate, comprising:
   providing a base substrate;
   forming a pattern of a first conducting layer on the base substrate;
   forming a first insulating layer provided with a first opening on the pattern of the first conducting layer;
   fabricating an inorganic protective layer on the first insulating layer using a mask for fabricating the first insulating layer, wherein the inorganic protective layer comprises at least a first inorganic protective layer portion, and the first inorganic protective layer portion does not overlap with the first opening; the inorganic protective layer further comprises a second inorganic protective layer portion, wherein the second inorganic protective layer portion is located on a side of the first insulating layer facing away from the base substrate and is located on a side of the first inorganic protective layer portion far away from the first opening; in a direction perpendicular to the base substrate, a thickness of the second inorganic protective layer portion is less than a thickness of the first inorganic protective layer portion; and
   forming a pattern of a second conducting layer on the inorganic protective layer, wherein the pattern of the second conducting layer is connected with the pattern of the first conducting layer through the first opening, the second conducting layer comprises a first portion and a second portion, the first portion is located within the first opening, and the second portion is located outside the first opening, and in the direction perpendicular to the base substrate, a thickness $h_2$ of the second portion and the thickness $h_1$ of the first inorganic protective layer portion satisfy the following relationship:

$h_2 = K * h_1$, wherein $12 \leq K \leq 18$.

8. The fabrication method according to claim 7, wherein the forming the pattern of the second conducting layer on the inorganic protective layer further comprises:
   forming the pattern of the second conducting layer on the inorganic protective layer using a dry etching process;
   after forming the pattern of the second conducting layer on the inorganic protective layer, the fabrication method further comprises:
   removing residual $Cl_2$ during the dry etching process using $CF_4$ and $O_2$ and the inorganic protective layer made of an a-Si material that is not shielded by the pattern of the second conducting layer.

9. A display device, comprising a display substrate, wherein the display substrate comprises:
   a base substrate;
   a first conducting layer, located on the base substrate;
   a first insulating layer, located on a side of the first conducting layer facing away from the base substrate, wherein the first insulating layer is provided with a first opening;
   a second conducting layer, connected to the first conducting layer through the first opening, and comprising a first portion and a second portion, wherein the first portion is located within the first opening, and the second portion is located outside the first opening and located on a side of the first insulating layer facing away from the base substrate; and
   an inorganic protective layer, comprising at least a first inorganic protective layer portion located between the second portion and the first insulating layer; wherein in a direction perpendicular to the base substrate, a thickness $h_1$ of the first inorganic protective layer portion and a thickness $h_2$ of the second portion satisfy the following relationship:

$h_2 = K * h_1$, wherein $12 \leq K \leq 18$;

wherein the inorganic protective layer further comprises a second inorganic protective layer portion, wherein the second inorganic protective layer portion is located on the side of the first insulating layer facing away from the base substrate and is located on a side of the first inorganic protective layer portion far away from the first opening; in the direction perpendicular to the base substrate, a thickness of the second inorganic protective layer portion is less than the thickness of the first inorganic protective layer portion.

10. The display device according to claim 9, wherein an orthographic projection of an edge of a side of the first inorganic protective layer portion far away from the first opening on the base substrate is located on a side, far away from the first opening, of an orthographic projection of an edge of a side of the second portion far away from the first opening on the base substrate.

11. The display device according to claim 10, wherein a material of the second conducting layer comprises an aluminum element.

12. The display device according to claim 10, wherein a material of the first insulating layer comprises an organic insulating material.

13. The display device according to claim 9, wherein the inorganic protective layer further comprises a third inorganic protective layer portion lapping on a side surface of the first insulating layer close to the first opening.

14. The display device according to claim 13, wherein a material of the second conducting layer comprises an aluminum element.

15. The display device according to claim 13, wherein a material of the first insulating layer comprises an organic insulating material.

16. The display device according to claim 9, wherein 400 Å $\leq h_1 \leq$ 600 Å, and 5000 Å $\leq h_2 \leq$ 10000 Å.

17. The display device according to claim 9, wherein a material of the second conducting layer comprises an aluminum element.

18. The display device according to claim 9, wherein a material of the first insulating layer comprises an organic insulating material.

* * * * *